United States Patent [19]

Choy et al.

[11] Patent Number: 5,530,621
[45] Date of Patent: Jun. 25, 1996

[54] PORTABLE ELECTRONIC MODULE DEVICE WITH TACTILE BUTTON AND TACT SWITCH

[75] Inventors: Chong H. Choy; Tuck S. Loke; Tat M. Chua, all of Singapore, Singapore

[73] Assignee: Motorola, Inc., Schaumburg, Ill.

[21] Appl. No.: 306,048

[22] Filed: Sep. 14, 1994

[51] Int. Cl.⁶ .................. H01K 5/00; H01H 3/00
[52] U.S. Cl. ............................ 361/728; 200/339
[58] Field of Search .................. 200/5 R, 5 A, 200/553, 557, 339; 361/728, 814

[56] References Cited

U.S. PATENT DOCUMENTS

| | | | |
|---|---|---|---|
| 3,612,793 | 10/1971 | Roeser | 200/448 |
| 3,916,135 | 10/1975 | Holden et al. | 200/339 |
| 3,941,953 | 3/1976 | Mission et al. | 200/5 R |
| 4,434,340 | 2/1984 | Kondo | 200/339 X |
| 4,520,240 | 5/1985 | Swindler | 200/5 R |
| 5,249,102 | 9/1993 | Ogawa et al. | 361/728 |
| 5,290,983 | 3/1994 | Roberts et al. | 200/557 |
| 5,414,596 | 5/1995 | Eaton et al. | 361/814 |

Primary Examiner—J. R. Scott
Attorney, Agent, or Firm—D. Andrew Floam

[57] ABSTRACT

A tactile button (10) for activating a tact switch within electronic circuitry enclosed by a housing element (104). The housing element (104) comprises an arcuate edge (106) forming an arcuate aperture (108). On a first end (110) of the arcuate edge (106) is a first lug (112) having a circular aperture. On a second end (116) of the arcuate edge (106) is a second lug (114) having a parabolic aperture. The arcuate member (102) comprises a first shaft (122), disposed on a rear surface (120), for connecting to the circular aperture, and a second shaft (124), also disposed on the rear surface (120), for connecting to the parabolic aperture. The arcuate member (102) further comprises a stopper (126) for limiting the movement of the arcuate member (102) within the housing element (104) when hinged to the first lug (112) and the second lug (114).

17 Claims, 2 Drawing Sheets

PORTABLE ELECTRONIC MODULE DEVICE WITH TACTILE BUTTON AND TACT SWITCH

FIELD OF THE INVENTION

This invention relates in general to tactile buttons for an electronic device and in particular to a tactile button for a portable electronic device.

BACKGROUND OF THE INVENTION

Electronic devices conventionally have user selectable features which are activated by tact switches. One conventional method to actuate a tact switch to activate a user selectable feature is by a tactile button that provides a physical interface between a user and the tact switch.

In an electronic device, for example, a selective call receiver, tactile buttons are formed by different methods. One method of forming a tactile button is with a molded piece of rubber or soft resin covering a tact switch. The molded piece of rubber or soft resin is then assembled with a molded housing that encloses electronic circuitry of the electronic device. However, a tactile button formed in this way is prone to inadvertent jamming because of an infolding of the molded piece of rubber or soft resin when the tactile button is depressed by a user Continual developments to reduce the physical size of a selective call receiver to improve portability further requires the use of small components forming the selective call receiver. A tactile button will, therefore, need to be small and yet durable to withstand a multitude of mechanical stresses resulting from accidental drops or knocks.

Furthermore, easily forming or assembling a component forming an electronic device helps to reduce its manufacturing cost. A tactile button that is easily assembled provides cost reduction benefits in the manufacture of the electronic device.

Thus, what is needed is an apparatus to provide an effective, durable, and low cost tactile button for portable electronic devices such as selective call receivers.

SUMMARY OF THE INVENTION

In carrying out the objects of the present invention in one form, there is provided a tactile button coupling to a housing element enclosing electronic circuitry including a tact switch. The tactile button comprises an arcuate member for coupling to the housing element and activating the tact switch. The arcuate member comprises a first shaft, integrally molded with and disposed on a rear surface, for connecting to a circular aperture of a first lug disposed on the housing element. The arcuate member also comprises a second shaft, integrally molded with and disposed on the rear surface, for connecting to a parabolic aperture of a second lug disposed on the housing element. The arcuate member further comprises a stopper, integrally molded with and disposed on a lateral surface of the arcuate member, for limiting movement of the arcuate member within the housing element.

DETAILED DESCRIPTION OF THE INVENTION

Figure 1:
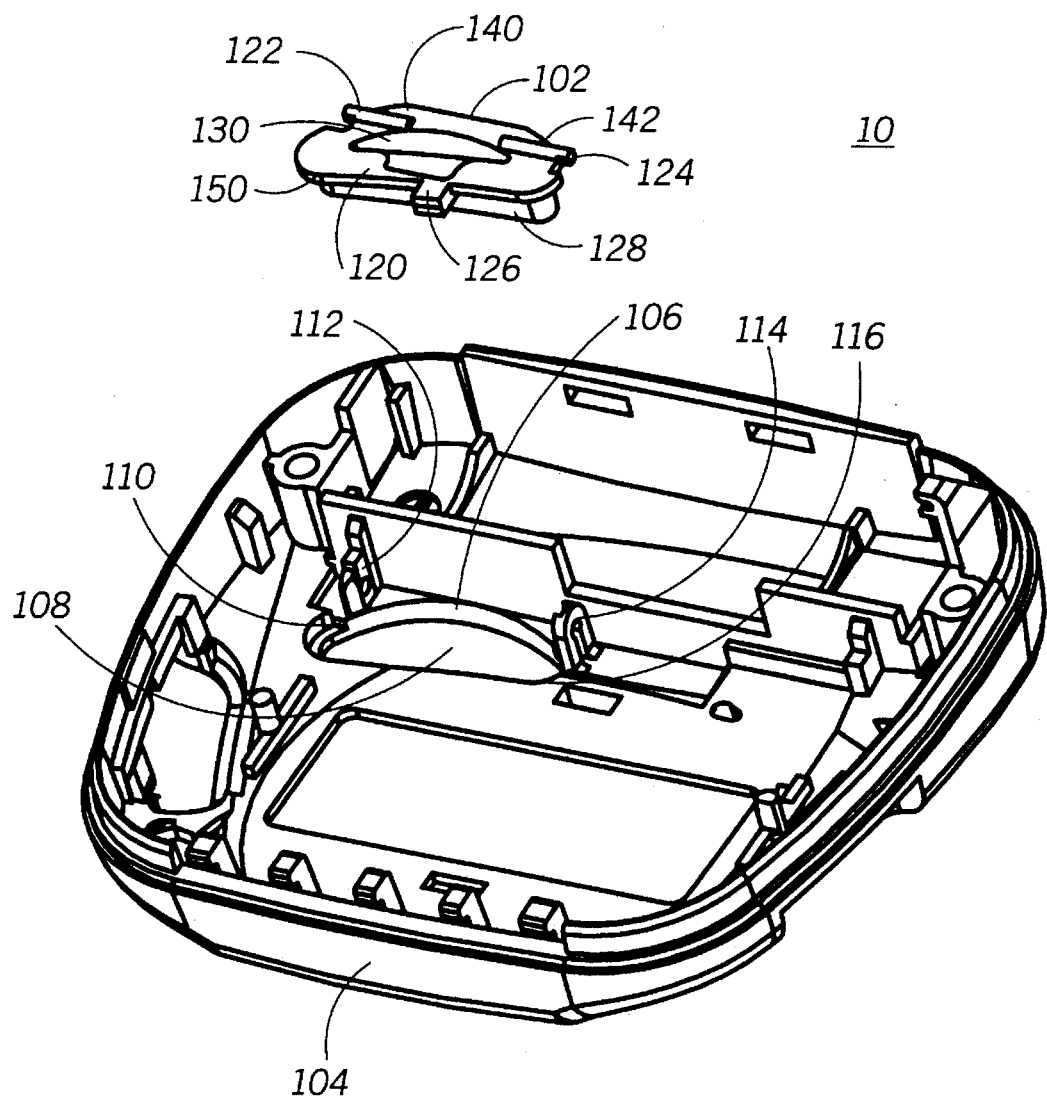
FIG. 1 shows a housing element and an arcuate member in accordance with a preferred embodiment of the present invention.

In accordance with a preferred embodiment of the present invention, FIG. 1 shows a tactile button 10 comprising an arcuate member 102 and a housing element 104. The housing element 104 forms a part of a molded housing that encloses electronic circuitry for a portable electronic device. One example of a portable electronic device is a selective call receiver.

As shown in FIG. 1 in accordance with the preferred embodiment of the present invention, the housing element 104 comprises an arcuate edge 106 forming an arcuate aperture 108. At a first end 110 of the arcuate edge 106 is a first lug 112. Disposed within and perpendicular to the housing element 104, the first lug 112 includes a first aperture. At a second end 116 of the arcuate edge 106 is a second lug 114. Disposed within and perpendicular to the housing element 104, the second lug 114 includes a second aperture. The second aperture has a circular top portion and a slotted bottom portion. The width of the slotted bottom portion is narrower than the diameter of the circular top portion.

Fabricated as one integrally molded resin for activating a tact switch of the portable electronic device, the arcuate member 102 comprises a sink mark 130 that is disposed proximally on a rear surface 120 and a perimetric flange 150 that extends laterally from the rear surface 120. The sink mark 130 controls formation of the arcuate member 102 during fabrication by providing a larger surface for cooling evenly after the molding process. Cooling evenly prevents warping of the arcuate member 102.

In accordance with the preferred embodiment of the present invention, the arcuate member 102 further comprises a first shaft 122, a second shaft 124, and a stopper 126. Substantially disposed on a first side 140 of the rear surface 120, the first shaft 122 is integrally molded with the arcuate member 102 and extends beyond the perimetric flange 150. Also integrally molded with the arcuate member 102 and extending beyond the perimetric flange 150, the second shaft 124 is substantially disposed on a second side 142 of the mar surface 120. In accordance with the preferred embodiment of the present invention, the stopper 126 is disposed proximally on and perpendicularly to a lateral surface 128 of the arcuate member 102 to limit the movement of the arcuate member 102 and prevent it from moving out of the housing element 104.

Assembling the tactile button 10, in accordance with the preferred embodiment of the present invention, begins with connecting the first shaft 122 to the first aperture of the first lug 112. Thus connected to the first aperture of the first lug 112, the arcuate member 102 now has an anchor point on the housing element 104. When the arcuate member 102 is connected to the first lug 112, an anchor point is provided for slidably pushing the second shaft 124 into the circular top portion of the second aperture and thereby connecting the second shaft 124 to the second lug 114. Hinged at the first lug 112 and the second lug 114, the movement of the arcuate member 102 out of the housing element 104 is limited by the stopper 126. In an opposite direction that goes into the housing element 104, the arcuate member 102 contacts a tact switch (not shown) on the electronic circuitry (not shown).

One advantage of the present invention is in assembling the tactile button 10 in accordance with the preferred embodiment of the present invention. No special tools are required for this assembly. Furthermore, hinging the arcuate member 102 to the first lug 112 and the second lug 114 prevents the arcuate member 102 from falling off when assembling the housing element 104 (that now includes the arcuate member 102) to enclose the electronic circuitry of the portable electronic device.

Figure 2:
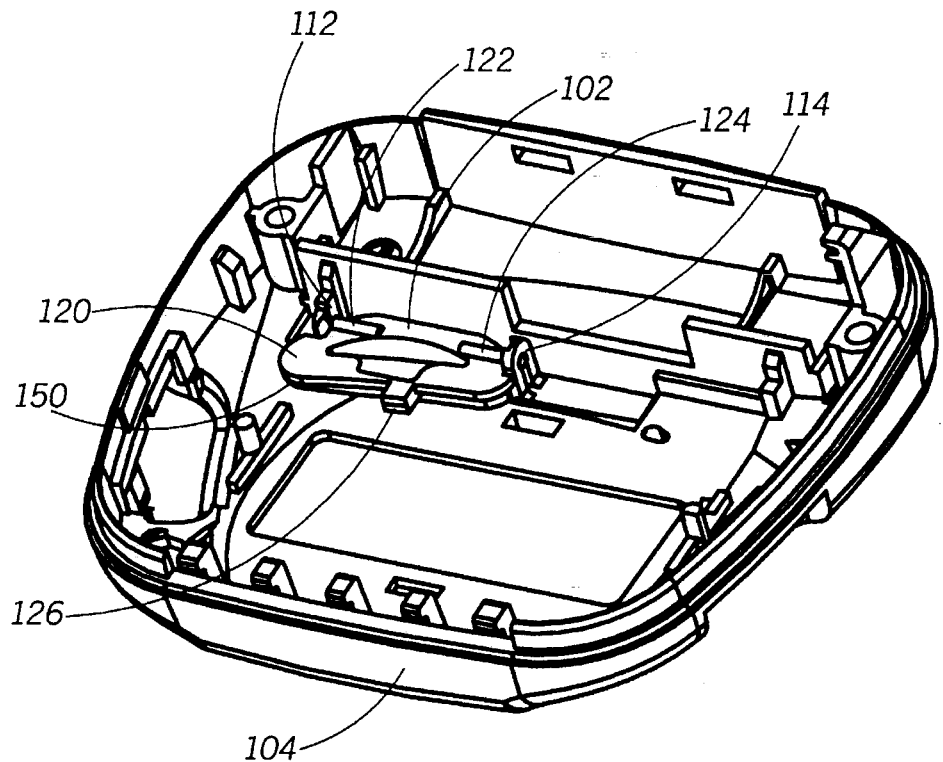
FIG. 2 is an isometric perspective of the arcuate member of FIG. 1 coupling to the housing element of FIG. 1 in accordance with the preferred embodiment of the present invention.

FIG. 2 shows an isometric perspective of the arcuate member 102 affixed to the housing element 104 in accordance with the preferred embodiment of the present invention. The rear surface 120 provides a larger area of contact with a tact switch and thereby increases the tolerance of aligning the tactile button 10 to the tact switch. By advantageously providing the larger area of contact to activate the tact switch, the arcuate member 102 need not be precisely aligned to the tact switch at a specific point, This affords a greater degree of tolerance as compared to a conventional tactile button that conforms to the shape of the tact switch and needs accurate placement over the tact switch to be effective.

Figure 3:
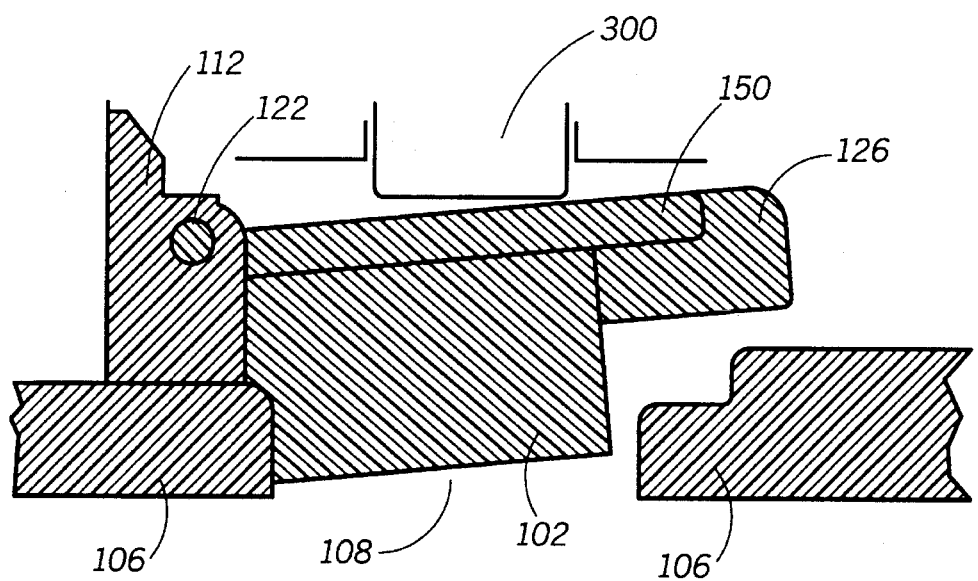
FIG. 3 shows a side perspective of the arcuate member of FIG. 1 engaging a tact switch within the housing element of FIG. I in accordance with the preferred embodiment of the present invention.

In accordance with the preferred embodiment of the present invention, FIG. 3 shows a side perspective of the arcuate member 102 activating a tact switch 300 within the housing element 104. Pivoting of the arcuate member 102 is shown where the first shaft 122 connects to the housing element 104 at the first aperture of the first lug 112. FIG. 3 also shows the stopper 126 extending laterally over the arcuate edge 106 within the housing element 104. Hence, the stopper 126 prevents the arcuate member from moving out of the housing element 104.

To activate the tact switch 300 of the electronic circuitry, the tactile button 10, in accordance with the preferred embodiment of the present invention, travels a distance of about 0.3 millimeter. This distance is less than a typical travel distance of between 0.8 millimeter to 1.0 millimeter required by a conventional tactile button. A shorter distance to activate the tact switch 300 provides an additional advantage in the present invention of restricting the arcuate member 102 from extending too far into and getting caught within the housing element 104. Hence, an improvement of the present invention is that it prevents inadvertent jamming of the tactile button 10.

In accordance with the preferred embodiment of the present invention of the tactile button 10, the arcuate member 102 is a singularly molded resin that does not require a separate assembly. When fabricated with a hard resin, the arcuate member is durable to mechanical stresses. Fitted into the housing element 104 that is molded with the first lug 112 and the second lug 114, the tactile button 10 does not add further costs to the portable electronic device.

By now it should be appreciated that there has been provided an effective, durable, and low cost tactile button for activating a tact switch in portable electronic devices such as selective call receivers.

We claim:

1. A tactile button for coupling to a housing element enclosing electronic circuitry including a tact switch wherein the housing element includes an arcuate edge, the tactile button comprising:

an arcuate member for coupling to the arcuate edge and having a rear surface for activating the tact switch, the arcuate member comprising:
a first shaft, integrally molded with and disposed on the rear surface, for connecting to a first aperture of a first lug disposed on the housing element;
a second shaft, integrally molded with and disposed on the rear surface, for connecting to a circular top portion of a second aperture of a second lug disposed on the housing element; and
a stopper, integrally molded with and disposed on a lateral surface, for limiting movement of the arcuate member wherein the stopper extends laterally over the arcuate edge within the housing element to prevent the arcuate member from moving out of the housing element.

2. The tactile button of claim 1 wherein the arcuate member further comprises a perimetric flange extending laterally from the rear surface.

3. The tactile button of claim 1 wherein the first shaft is substantially disposed on a first side of the rear surface.

4. The tactile button of claim 1 wherein the second shaft is substantially disposed on a second side of the rear surface.

5. The tactile button of claim 1 wherein the stopper is disposed proximally on and perpendicularly to the lateral surface.

6. An electronic device having electronic circuitry including a tact switch, the electronic device comprising:

a housing element for enclosing the electronic circuitry, the housing element comprising:
an arcuate edge integrally disposed on the housing element and forming an arcuate aperture;
a first lug having a first aperture and integrally disposed within and perpendicular to the housing element on a first end of the arcuate edge; and
a second lug having a second aperture and integrally disposed within and perpendicular to the housing element on a second end of the arcuate edge wherein the second aperture includes a circular top portion; and an arcuate member for coupling to the housing element and having a rear surface for activating the tact switch, the arcuate member comprising:
a first shaft, integrally molded with and disposed on the rear surface, for connecting to the first aperture;
a second shaft, integrally molded with and disposed on the rear surface, for connecting to the circular top portion; and
a stopper, integrally molded with and disposed on a lateral surface, for limiting movement of the arcuate member wherein the stopper extends laterally over the arcuate edge within the housing element to prevent the arcuate member from moving out of the housing element.

7. The electronic device of claim 6 wherein the arcuate member further comprises a perimetric flange extending laterally from the rear surface.

8. The electronic device of claim 6 wherein the first shaft is substantially disposed on a first side of the rear surface.

9. The electronic device of claim 6 wherein the second shaft is substantially disposed on a second side of the rear surface.

10. The electronic device of claim 6 wherein the stopper is disposed proximally on and perpendicularly to the lateral surface.

11. The electronic device of claim 6 wherein the electronic device comprises a selective call receiver.

12. A portable electronic device having electronic circuitry including a tact switch, the portable electronic device comprising:

a housing element for enclosing the electronic circuitry, the housing element comprising:
- an arcuate edge integrally disposed on the housing element and forming an arcuate aperture;
- a first lug having a first aperture and integrally disposed within and perpendicular to the housing element on a first end of the arcuate edge; and,
- a second lug having a second aperture and, integrally disposed within and perpendicular to the housing element on a second end of the arcuate edge wherein the second aperture includes a circular top portion;

and an arcuate member for coupling to the housing element and having a rear surface for activating the tact switch, the arcuate member comprising:
- a first shaft, integrally molded with and disposed on the rear surface, for connecting to the first aperture;
- a second shaft, integrally molded with and disposed on the rear surface, for connecting to the circular top portion; and
- a stopper, integrally molded with and disposed on a lateral surface, for limiting movement of the arcuate member wherein the stopper extends laterally over the arcuate edge within the housing element to prevent the arcuate member from moving out of the housing element.

13. The portable electronic device of claim 12 wherein the arcuate member further comprises a perimetric flange extending laterally from the rear surface.

14. The portable electronic device of claim 12 wherein the first shaft is substantially disposed on a first side of the rear surface.

15. The portable electronic device of claim 12 wherein the second shaft is substantially disposed on a second side of the rear surface.

16. The portable electronic device of claim 12 wherein the stopper is disposed proximally on and perpendicularly to the lateral surface.

17. The portable electronic device of claim 12 wherein the portable electronic device comprises a selective call receiver.

\* \* \* \* \*